(12) United States Patent
Tanaka et al.

(10) Patent No.: US 12,045,082 B2
(45) Date of Patent: Jul. 23, 2024

(54) ELECTRONIC CONTROL DEVICE

(71) Applicant: Hitachi Astemo, Ltd., Hitachinaka (JP)

(72) Inventors: Daisuke Tanaka, Hitachinaka (JP); Hidetatsu Yamamoto, Hitachinaka (JP)

(73) Assignee: HITACHI ASTEMO, LTD., Ibaraki (JP)

(*) Notice: Subject to any disclaimer, the term of this patent is extended or adjusted under 35 U.S.C. 154(b) by 41 days.

(21) Appl. No.: 18/013,784

(22) PCT Filed: Apr. 16, 2021

(86) PCT No.: PCT/JP2021/015725
§ 371 (c)(1),
(2) Date: Dec. 29, 2022

(87) PCT Pub. No.: WO2022/009497
PCT Pub. Date: Jan. 13, 2022

(65) Prior Publication Data
US 2023/0288954 A1  Sep. 14, 2023

(30) Foreign Application Priority Data
Jul. 6, 2020 (JP) .................. 2020-116119

(51) Int. Cl.
G06F 1/12 (2006.01)
H03K 3/01 (2006.01)

(52) U.S. Cl.
CPC .......... G06F 1/12 (2013.01); H03K 3/01 (2013.01)

(58) Field of Classification Search
None
See application file for complete search history.

(56) References Cited

U.S. PATENT DOCUMENTS 11,173,922 B2 * 11/2021 Sakamoto ............. B60W 30/18
11,247,702 B2 *  2/2022 Sakamoto ......... B60W 60/0015

FOREIGN PATENT DOCUMENTS

JP   2001-162101 A   1/2001
JP   2004-234098 A   8/2004
JP        6494018 A   4/2019

OTHER PUBLICATIONS

International Search Report, PCT/JP2021/015725, dated Jul. 13, 2021. 2 pages.

* cited by examiner

Primary Examiner — Jeffrey S Zweizig
(74) Attorney, Agent, or Firm — Volpe Koenig

(57) ABSTRACT

There is provided an electronic control device that performs distributed processing using a plurality of microcomputers and can perform highly accurate time synchronization between the microcomputers with less delay without hindering arithmetic processing of each microcomputer. The device includes a plurality of microcomputers, and a waveform generation circuit connected between a master microcomputer serving as a time synchronization source and a slave microcomputer that performs time synchronization, among the plurality of microcomputers, wherein the master microcomputer outputs a reset signal synchronized with time to the waveform generation circuit, the waveform generation circuit outputs a waveform signal corresponding to a change in time of the master microcomputer, to the slave microcomputer, and the slave microcomputer measures a voltage value of the waveform signal and detects time corresponding to the measured voltage value.

11 Claims, 11 Drawing Sheets

| VOLTAGE [V] | TIME [ms] |
|---|---|
| 0 | 0 |
| 0.3 | 10 |
| ⋮ | ⋮ |
| 3.0 | 100 |

ELECTRONIC CONTROL DEVICE

TECHNICAL FIELD

The present invention relates to a configuration of an electronic control device and control thereof, and particularly relates to a technique that is effective when applied to an electronic control device that is required to perform highly reliable and highly accurate control, such as an automatic driving system.

BACKGROUND ART

In an electronic control unit (ECU) that controls automatic driving, an arithmetic processing device (microcomputer) that performs external recognition processing is mounted. Due to an increase in required processing performance, a plurality of microcomputers is used to perform distributed processing in some cases. In performing distributed processing, respective microcomputers need to perform processing in synchronization with each other. Then, for synchronous processing, the microcomputers need to be synchronized in time with each other.

As a typical method of synchronizing microcomputers in time, there is a method of exchanging time information using serial communication or the like. A master microcomputer serving as a synchronization source transmits a communication frame including time information to a slave microcomputer serving as a receiving destination, and the slave microcomputer extracts the time information from the received communication frame and corrects the time of the slave microcomputer.

As a background art of the present technical field, there is a technique such as PTL 1, for example. PTL 1 discloses "a technique of activating an interrupt function and setting a timer counter at the same time when it starts to receive a communication frame, measuring a delay time required for processing of the received frame with the timer counter, and removing a delay in the frame processing".

CITATION LIST

Patent Literature

PTL 1: JP 2004-234098 A

SUMMARY OF INVENTION

Technical Problem

A typical automatic driving system includes, for example, a large number of sensors for grasping a situation around a vehicle, a vehicle control device that outputs a control command, and a plurality of actuator control devices that perform engine control, brake control, power steering control, and the like, respectively, in accordance with the control command from the vehicle control device.

Here, the vehicle control device of the automatic driving system is required to have high computing power in order to realize automatic driving, and is formed of a high-performance arithmetic processing device. As a level of automatic driving increases, the number of required sensors and the amount of arithmetic processing increase. Thus, a plurality of arithmetic processing devices is used, and sensors are connected to different arithmetic processing devices, in some cases. In such a case, information of each sensor signal cannot be correctly integrated unless processing is performed simultaneously by the plurality of arithmetic processing devices. For this reason, it is necessary to perform time synchronization between the arithmetic processing devices with high accuracy.

In a case where the method of PTL 1 described above is used for time synchronization between arithmetic processing devices, it is necessary to use an interrupt function of the arithmetic processing device.

In using an interrupt function, time required for an interrupt function to be activated differs depending on the interrupt priority of an operating system (OS) installed in each arithmetic processing device. Further, because of interrupt processing, arithmetic processing for automatic driving may probably be suspended, which causes a concern that the arithmetic processing time is increased and processing cannot be performed in time.

Moreover, the method of PTL 1 can remove a delay caused by processing for receiving, but cannot remove a delay caused by processing for transmitting. Thus, a system that requires highly accurate time synchronization, such as automatic driving, may probably suffer from a problem of delay.

In view of this, an object of the present invention is to provide an electronic control device that performs distributed processing using a plurality of microcomputers and can perform highly accurate time synchronization between microcomputers with less delay without hindering arithmetic processing of each microcomputer.

Solution to Problem

In order to solve the above problems, the present invention includes a plurality of microcomputers, and a waveform generation circuit connected between a master microcomputer serving as a time synchronization source and a slave microcomputer that performs time synchronization, among the plurality of microcomputers, wherein the master microcomputer outputs a reset signal synchronized with time to the waveform generation circuit, the waveform generation circuit outputs a waveform signal corresponding to a change in time of the master microcomputer, to the slave microcomputer, and the slave microcomputer measures a voltage value of the waveform signal and detects time corresponding to the measured voltage value.

Advantageous Effects of Invention

According to the present invention, it is possible to provide an electronic control device that performs distributed processing using a plurality of microcomputers and can perform highly accurate time synchronization between microcomputers with less delay without hindering arithmetic processing of each microcomputer.

Therefore, it is possible to implement a highly reliable and highly accurate electronic control device and an automatic driving system using the electronic control device.

Problems, configurations, and effects other than those described above will be clarified by the following description of embodiments.

DESCRIPTION OF EMBODIMENTS

Hereinafter, embodiments of the present invention will be described with reference to the drawings. In each of the drawings, the same components are denoted by the same reference signs, and detailed description of overlapping portions will be omitted.

<<Configuration Example of Automatic Driving System>>

First, a configuration of an automatic driving system (vehicle control system) to which the present invention is applied will be described with reference to FIG. 1.

Figure 1:
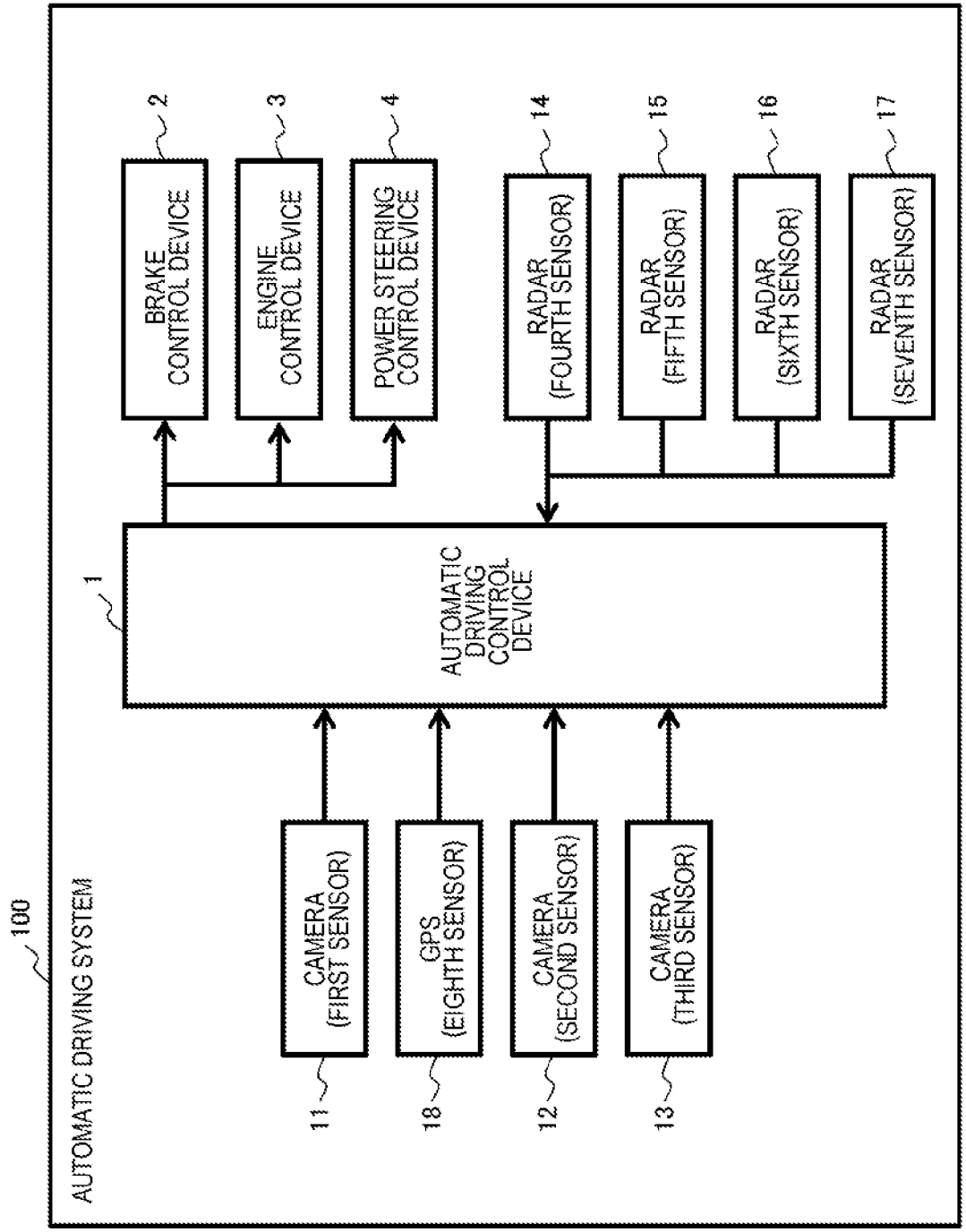
FIG. 1 is a schematic configuration diagram of an automatic driving system to which the present invention is applied.

FIG. 1 is a diagram illustrating a configuration example of an automatic driving system provided in a vehicle to which the present invention is applied. As illustrated in FIG. 1, the automatic driving system 100 includes a camera (first sensor) 11, a camera (second sensor) 12, a camera (third sensor) 13, a radar (fourth sensor) 14, a radar (fifth sensor) 15, a radar (sixth sensor) 16, a radar (seventh sensor) 17, and a global positioning system (GPS) (eighth sensor) 18, which are external recognition sensors for recognizing the external situation of the vehicle.

Further, the automatic driving system 100 includes an automatic driving control device 1, a brake control device 2, an engine control device 3, and a power steering control device 4. The brake control device 2, the engine control device 3, and the power steering control device 4 can be collectively referred to as an actuator control device that controls operations of the vehicle.

The fourth sensor 14, the fifth sensor 15, the sixth sensor 16, and the seventh sensor 17 that are radar information, as well as the automatic driving control device 1, the brake control device 2, the engine control device 3, and the power steering control device 4, are connected so as to be able to communicate with each other by an in-vehicle network such as a controller area network (CAN) or Ethernet (registered trademark), for example.

The brake control device 2 is a control device that performs brake control (braking-force control) of the vehicle, and the engine control device 3 is a control device that controls an engine that generates driving force of the vehicle. The power steering control device 4 is a control device that controls power steering of the vehicle.

Here, when receiving a request for automatic driving, the automatic driving control device 1 calculates a route (course) that the vehicle takes in traveling, based on external information from the first sensor 11 to the seventh sensor 17, the eighth sensor 18, and the like, and outputs a control command for a brake, driving force, and the like to the brake control device 2, the engine control device 3, and the power steering control device 4 so as to move the vehicle, following the calculated route.

The brake control device 2, the engine control device 3, and the power steering control device 4 receive a control command of automatic traveling control from the automatic driving control device 1, and output an operation signal to each target being controlled (actuator).

First Embodiment

Next, with reference to FIGS. 2 to 4, the configuration and operations (control) of the automatic driving control device 1 according to the first embodiment of the present invention will be described.

Figure 2:
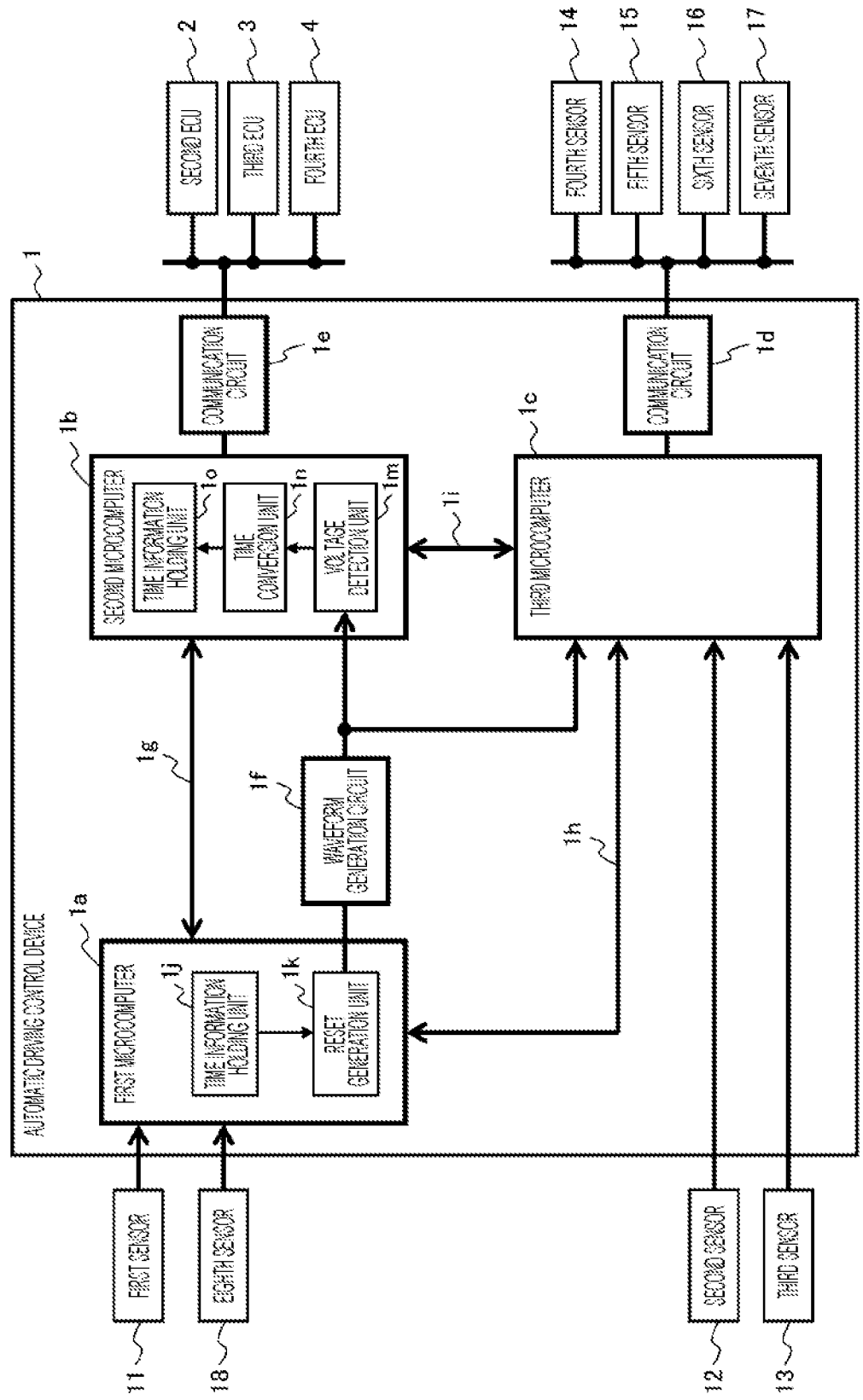
FIG. 2 is a diagram illustrating an internal configuration of an automatic driving control device (first ECU) according to a first embodiment of the present invention.

FIG. 2 is a diagram illustrating an internal configuration of the automatic driving control device 1 (first ECU) according to the present embodiment.

As illustrated in FIG. 2, the automatic driving control device 1 (first ECU) of the present embodiment includes a plurality of microcomputers (a first microcomputer 1a, a second microcomputer 1b, a third microcomputer 1c). Output signals of the camera (first sensor) 11 and the GPS (eighth sensor) 18 are input to the first microcomputer 1a, and the first microcomputer 1a transmits a result of arithmetic processing to the second microcomputer 1b or the third microcomputer 1c via an inter-microcomputer communication line 1g or an inter-microcomputer communication line 1h.

Output signals of the camera (second sensor) 12 and the camera (third sensor) 13 are input to the third microcomputer 1c, output signals of the radar (fourth sensor) 14, the radar (fifth sensor) 15, the radar (sixth sensor) 16, and the radar (seventh sensor) 17 are input to the third microcomputer 1c via a communication circuit 1d, and the third microcomputer 1c transmits a result of arithmetic processing to the second microcomputer 1b via an inter-microcomputer communication line 1i.

The second microcomputer 1b integrates sensor information from the results of processing of the first microcomputer 1a and the third microcomputer 1c to determine external information, calculates a route (course) that the vehicle takes in travelling, and outputs a control signal to the brake control device (second ECU) 2, the engine control device (third ECU) 3, and the power steering control device (fourth ECU) 4 via a communication circuit 1e.

The second microcomputer 1b can extract highly accurate time information from GPS information, and can hold accurate time information therein.

Further, the automatic driving control device 1 (first ECU) includes a waveform circuit 1f, generation the first microcomputer 1a controls a reset signal of the waveform generation circuit 1f, and an output signal of the waveform generation circuit 1f is input to the second microcomputer 1b and the third microcomputer 1c.

The first microcomputer 1a provides a notification of a start of reset generation synchronized with time, received from a time information holding unit 1j therein, to a reset generation unit 1k, and the reset generation unit 1k generates a reset signal and outputs the reset signal to the waveform generation circuit 1f.

After reset is released, the waveform generation circuit 1f periodically changes a voltage and generates a waveform in which time and a voltage have a corresponding relationship with each other.

The waveform generation circuit 1f releases a reset state inside the waveform generation circuit 1f using the input reset signal, and starts waveform generation and signal output. As a result, a start of waveform generation is synchronized with time of the microcomputer.

Figure 3:
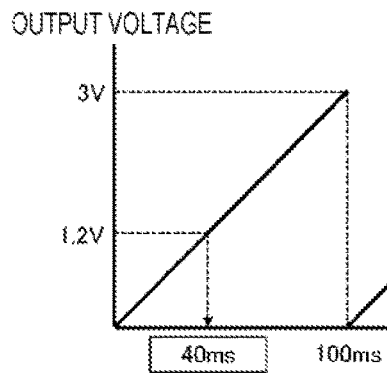
FIG. 3 is a diagram illustrating an example of a relationship between a voltage of a signal output from a waveform generation circuit and time according to the first embodiment of the present invention.

FIG. 3 is a diagram illustrating an example of a relationship between a voltage of an output signal of the waveform generation circuit 1f and time according to the present embodiment.

There is known a sawtooth waveform as a waveform in which a voltage and time are brought into a one-to-one correspondence with each other periodically. FIG. 3 illustrates a sawtooth waveform with an amplitude of 3 V and a period of 100 ms. When, as illustrated, a waveform has a one-to-one correspondence periodically and the amplitude and period thereof are known, time can be obtained from a voltage value of the signal waveform.

Figure 4:
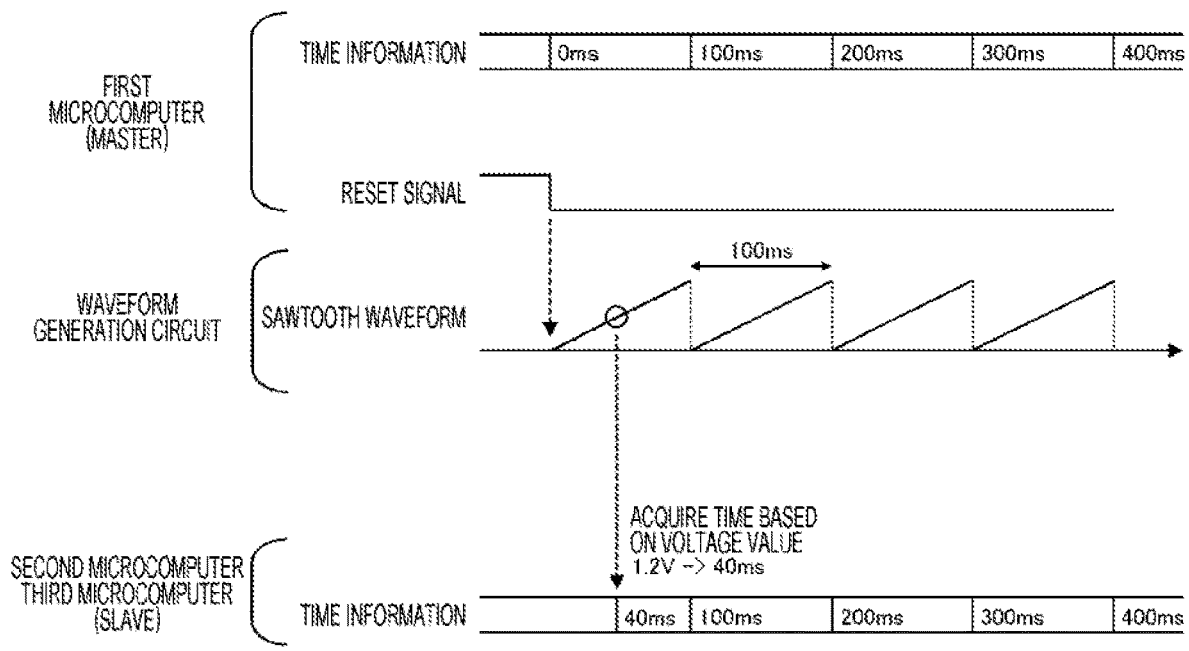
FIG. 4 is a sequence diagram illustrating a time synchronization method according to the first embodiment of the present invention.

FIG. 4 is a sequence diagram illustrating a time synchronization method according to the present embodiment.

The second microcomputer 1b acquires a signal waveform voltage using a voltage detection unit 1m therein at a freely-selected time.

A time conversion unit 1n converts a voltage into time by having either a correspondence table indicating a voltage-to-time corresponding relationship as illustrated in FIG. 3 or an arithmetic expression indicating a voltage-to-time corresponding relationship.

A time information holding unit 1o compares time information held in the microcomputer with the time acquired by the time conversion unit 1n, and corrects the time of the microcomputer.

Whereas FIG. 3 illustrates a sawtooth waveform, a sawtooth waveform is not necessarily required, and any waveform in which a voltage is brought into a one-to-one correspondence periodically is acceptable.

Further, the third microcomputer 1c, like the second microcomputer 1b, can include a voltage detection unit, a time conversion unit, and a time information holding unit and can perform time synchronization.

As described above, the electronic control device according to the present embodiment includes the plurality of microcomputers (the first microcomputer 1a, the second microcomputer 1b, the third microcomputer 1c) and the waveform generation circuit 1f connected between the master microcomputer (the first microcomputer 1a) serving as a time synchronization source and the slave microcomputers (the second microcomputer 1b, the third microcomputer 1c) that perform time synchronization among the plurality of microcomputers (the first microcomputer 1a, the second microcomputer 1b, the third microcomputer 1c). The master microcomputer (the first microcomputer 1a) outputs a reset signal synchronized with time to the waveform generation circuit 1f. The waveform generation circuit 1f outputs a waveform signal corresponding to a change in time of the master microcomputer (the first microcomputer 1a) to the slave microcomputers (the second microcomputer 1b, the third microcomputer 1c). The slave microcomputers (the second microcomputer 1b, the third microcomputer 1c) measure a voltage value of the waveform signal and detect time corresponding to the measured voltage value.

This allows time synchronization between the microcomputers to be achieved with a relatively simple circuit configuration.

Further, after reset is released by the reset signal, the waveform generation circuit 1f periodically changes a voltage and outputs a waveform signal (sawtooth waveform) in which time in one period and a voltage value are in a one-to-one correspondence. The slave microcomputers (the second microcomputer 1b, the third microcomputer 1c) acquire the voltage value of the waveform signal (sawtooth waveform) of the waveform generation circuit 1f and calculate time from the acquired voltage value.

As a result, time and a voltage can be brought into a one-to-one correspondence, and elapsed time can be easily calculated.

Second Embodiment

Figure 5:
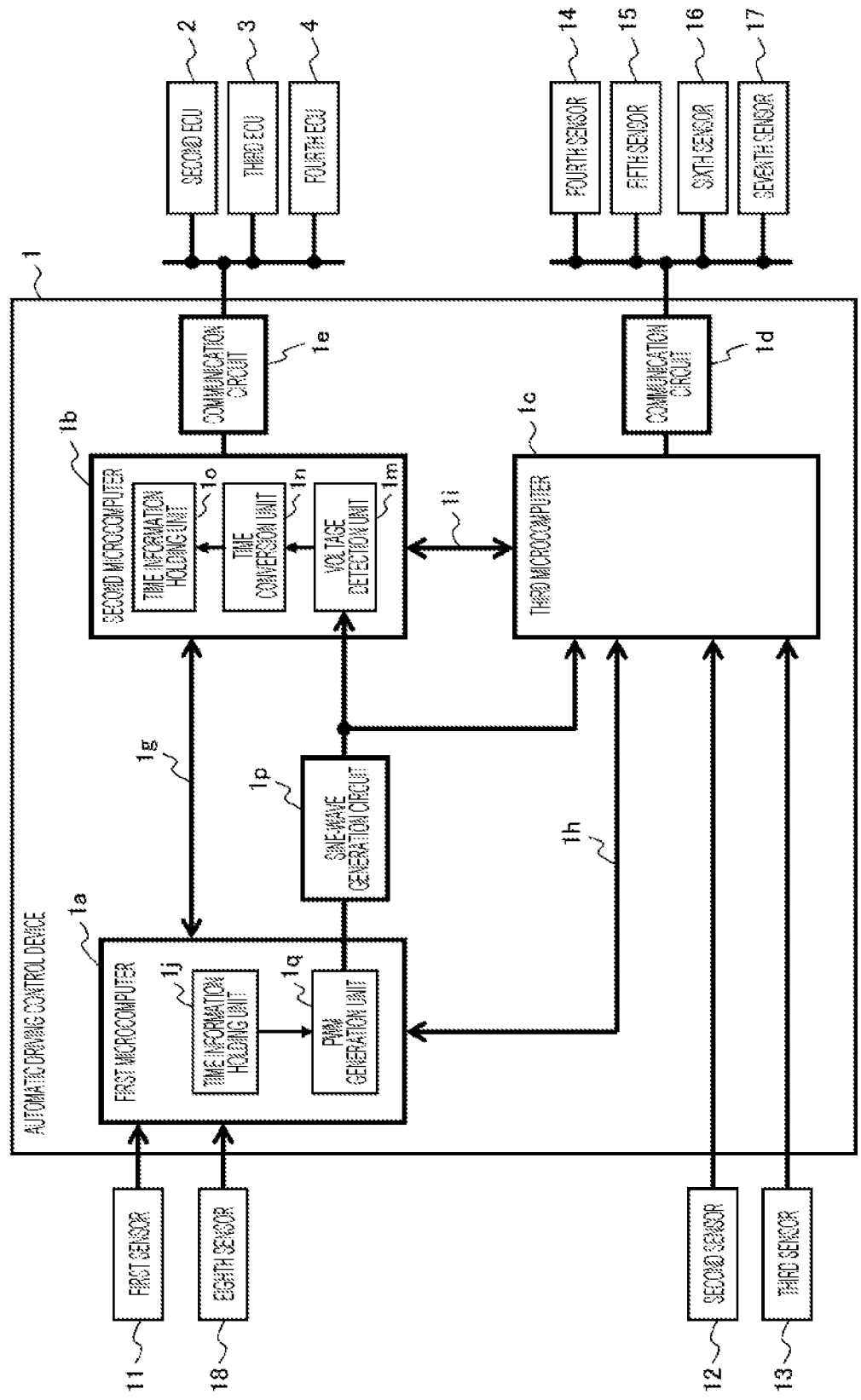
FIG. 5 is a diagram illustrating an internal configuration of an automatic driving control device (first ECU) according to a second embodiment of the present invention.
Figure 6:
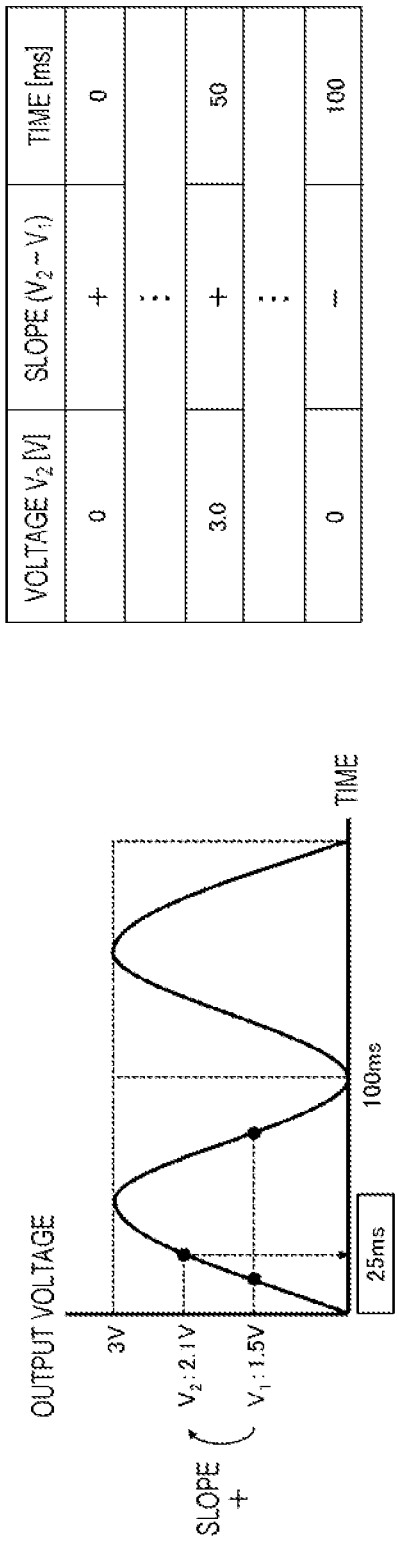
FIG. 6 is a diagram illustrating an example of a relationship between a voltage of a signal output from a sine-wave generation circuit and time according to the second embodiment of the present invention.
Figure 7:
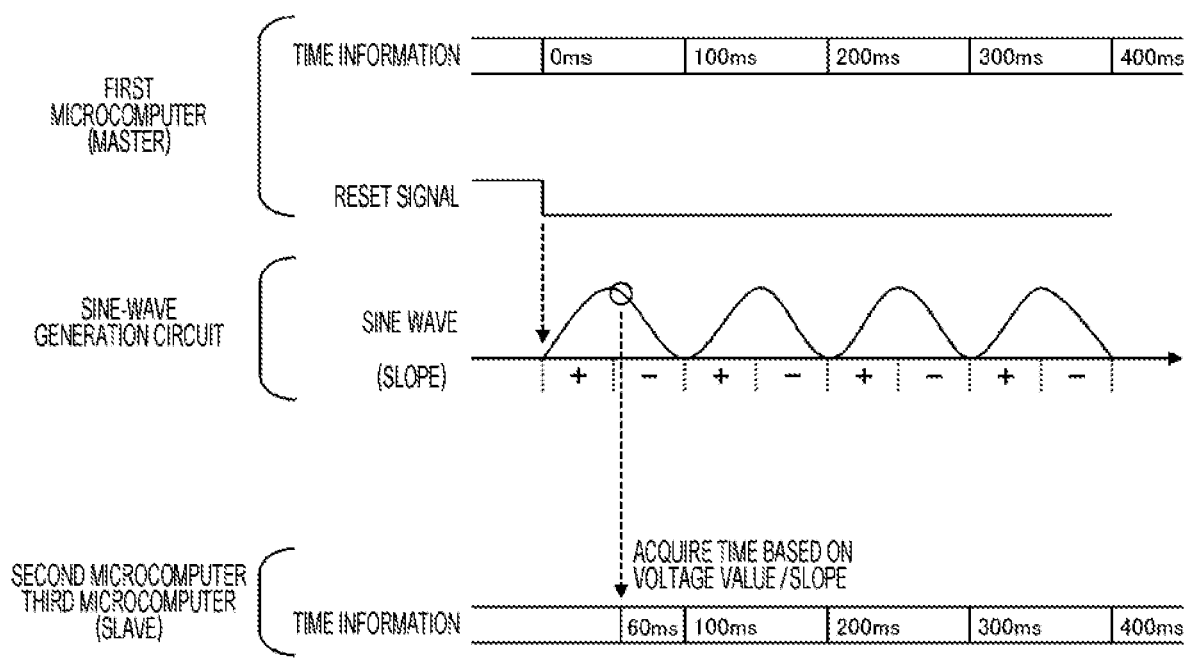
FIG. 7 is a sequence diagram illustrating a time synchronization method according to the second embodiment of the present invention.

With reference to FIGS. 5 to 7, a configuration and operations (control) of the automatic driving control device 1 according to a second embodiment of the present invention will be described.

FIG. 5 is a diagram illustrating an internal configuration of the automatic driving control device 1 (first ECU) according to the present embodiment. The automatic driving control device 1 of the present embodiment is different from that of the first embodiment (FIG. 2) in including a sine-wave generation circuit 1p and a PWM generation unit 1q in place of the waveform generation circuit 1f and the reset generation unit 1k of the first embodiment (FIG. 2). The other components are similar to those of the first embodiment (FIG. 2).

In the present embodiment, a sine wave is generated using a PWM function of the microcomputer to perform time synchronization. The first microcomputer 1a provides a notification of a start of PWM generation synchronized with time, received from the time information holding unit 1j therein, to the PWM generation unit 1q, and the PWM generation unit 1q generates a PWM signal and outputs the PWM signal to the sine-wave generation circuit 1p.

The sine-wave generation circuit 1p outputs a sine wave corresponding to the voltage and period of the PWM signal using the input PWM signal.

FIG. 6 is a diagram illustrating an example of a relationship between a voltage of an output signal of the sine-wave generation circuit 1p and time according to the present embodiment.

A sine-wave signal has the same voltage twice in one period, and hence determination is made using a voltage value in combination with a slope of the sine-wave signal. A voltage value is consecutively acquired twice ($V_1$ and $V_2$) in a short period of time with respect to the period of the sine-wave signal, and the first voltage value is subtracted from the second voltage value ($V_2-V_1$), so that the slope can be determined. Then, time can be obtained from the voltage value and the slope of the sine-wave signal.

FIG. 7 is a sequence diagram illustrating a time synchronization method according to the present embodiment.

The second microcomputer 1b acquires a signal waveform voltage using the voltage detection unit 1m therein at a freely-selected time.

The time conversion unit 1n converts a voltage into time by having either a correspondence table indicating a voltage-to-time corresponding relationship as illustrated in FIG. 6 or an arithmetic expression indicating a voltage-to-time corresponding relationship.

A time information holding unit 1o compares time information held in the microcomputer with the time acquired by the time conversion unit 1n, and corrects the time of the microcomputer.

As described above, in the electronic control device of the present embodiment, the waveform generation circuit (the sine-wave generation circuit 1p) periodically changes a voltage and outputs a waveform signal (sine-wave signal) that is in a one-to-one correspondence with time in one period based on the voltage value and a slope of the waveform after reset is released by the reset signal. The slave microcomputers (the second microcomputer 1b, the third microcomputer 1c) acquire the voltage value of the waveform signal (sine-wave signal) of the waveform generation circuit (the sine-wave generation circuit 1p) and calculate time from the acquired voltage value.

As a result, also in a case where a waveform signal that cannot uniquely determine time from a voltage, such as a sine wave, is used, elapsed time can be calculated by relatively simple calculation (calculation of a slope of a waveform).

Third Embodiment

Figure 8:
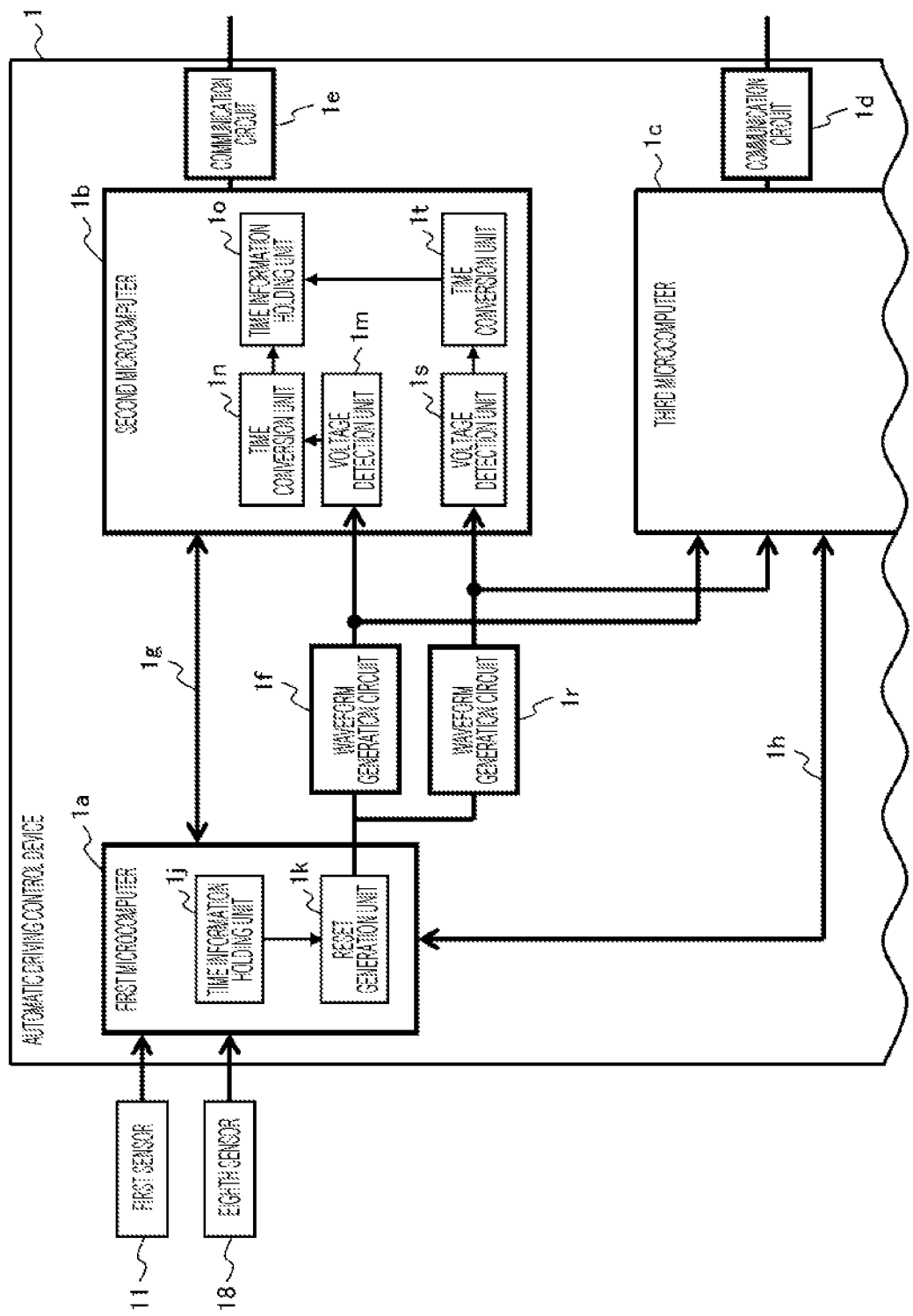
FIG. 8 is a diagram illustrating an internal configuration of an automatic driving control device (first ECU) according to a third embodiment of the present invention.
Figure 9:
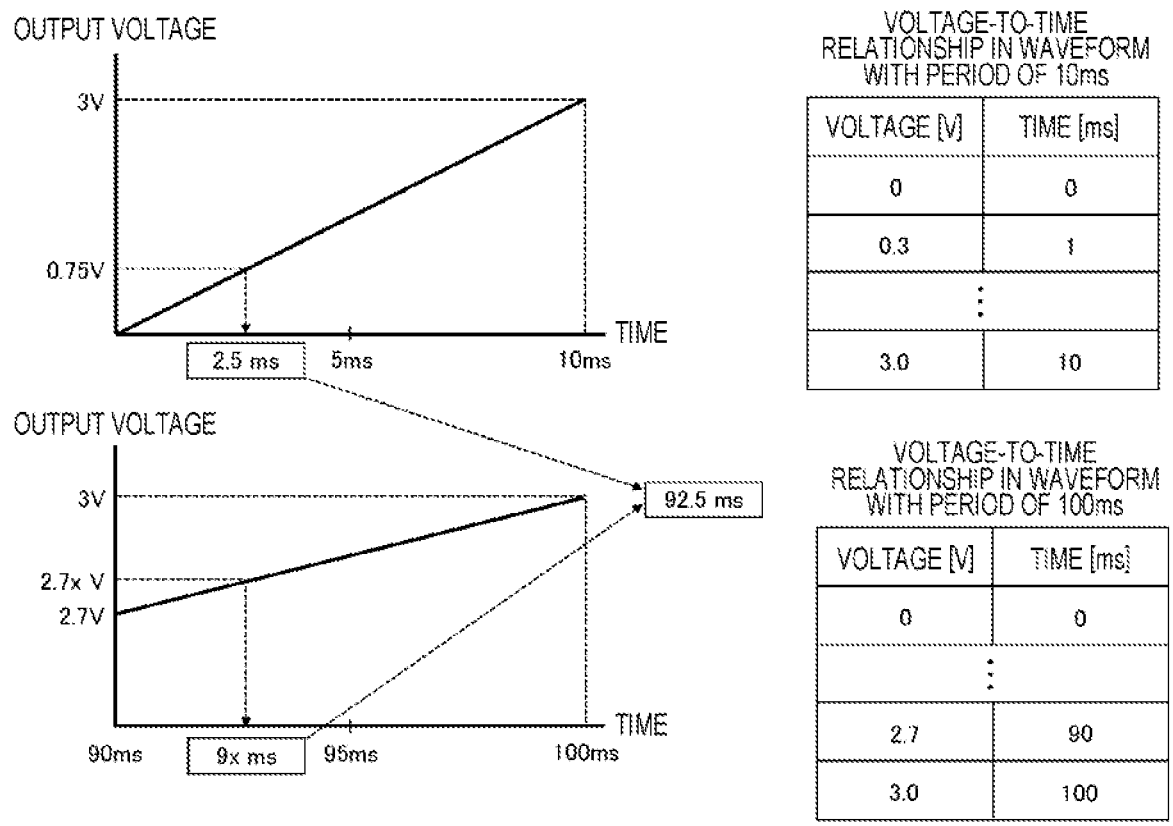
FIG. 9 is a diagram illustrating an example of a relationship between a voltage of a signal output from a waveform generation circuit and time according to the third embodiment of the present invention.

With reference to FIGS. 8 and 9, a configuration and operations (control) of the automatic driving control device 1 according to a third embodiment of the present invention will be described.

FIG. 8 is a diagram illustrating an internal configuration of the automatic driving control device 1 (first ECU) according to the present embodiment. The automatic driving control device 1 of the present embodiment is different from that of the first embodiment (FIG. 2) in that each of the waveform generation circuit 1f, the voltage detection unit 1m, and the time conversion unit 1n of the first embodiment (FIG. 2) is provided in plural numbers (two in this embodiment). The other components are similar to those of the first embodiment (FIG. 2).

In the present embodiment, time synchronization is performed using a plurality of waveform generation circuits 1f and 1r having different periods. The waveform generation circuit 1f described in the first embodiment and the waveform generation circuit 1r having a different period are provided, receive a reset signal output from the first microcomputer 1a, and output waveform signals to the second microcomputer 1b and the third microcomputer 1c. The waveform generation circuit 1r, a voltage detection unit 1s, and a time conversion unit 1t are connected in parallel with the waveform generation circuit 1f, the voltage detection unit 1m, and the time conversion unit 1n between the reset generation unit 1k and the time information holding unit 1o.

FIG. 9 is a diagram illustrating an example of a relationship between a voltage of an output signal of each of the waveform generation circuits 1f and 1r and time according to the present embodiment. There is shown two types of sawtooth waveforms for voltage-to-time correspondences in a case of an amplitude of 3 V and a period of 100 ms and in a case of an amplitude of 3 V and a period of 10 ms.

With a waveform having a long period, long time can be estimated, but an acquired voltage is required to be accurate in order to accurately estimate time. Meanwhile, with a waveform having a short period, only short time can be estimated, but a voltage may be less accurate. Acquiring voltages in waveforms having different periods eliminates a need for high voltage resolution, and highly accurate time can be obtained.

The second microcomputer 1b acquires a signal waveform voltage using the voltage detection units 1m and 1s therein at a freely-selected time.

The time conversion units 1n and 1t convert a voltage into time by having either a correspondence table indicating a voltage-to-time corresponding relationship as illustrated in FIG. 9 or an arithmetic expression indicating a voltage-to-time corresponding relationship.

The time information holding unit 1o compares time information held in the microcomputer with a combination of the time acquired by the time conversion unit 1n and the time acquired by the time conversion unit 1t, and corrects the time of the microcomputer.

As described above, in the electronic control device of the present embodiment, the waveform generation circuits 1f and 1r are formed of parallel connection of a plurality of circuits that output waveform signals having different periods.

Consequently, time can be synchronized using a combination of voltage values of a plurality of waveform signals, and accuracy of time synchronization between the microcomputers can be improved independently of the accuracy of the voltage detection units 1m and 1s serving AD converters mounted in the slave microcomputers (the second microcomputer 1b and the third microcomputer 1c).

Fourth Embodiment

Figure 10:
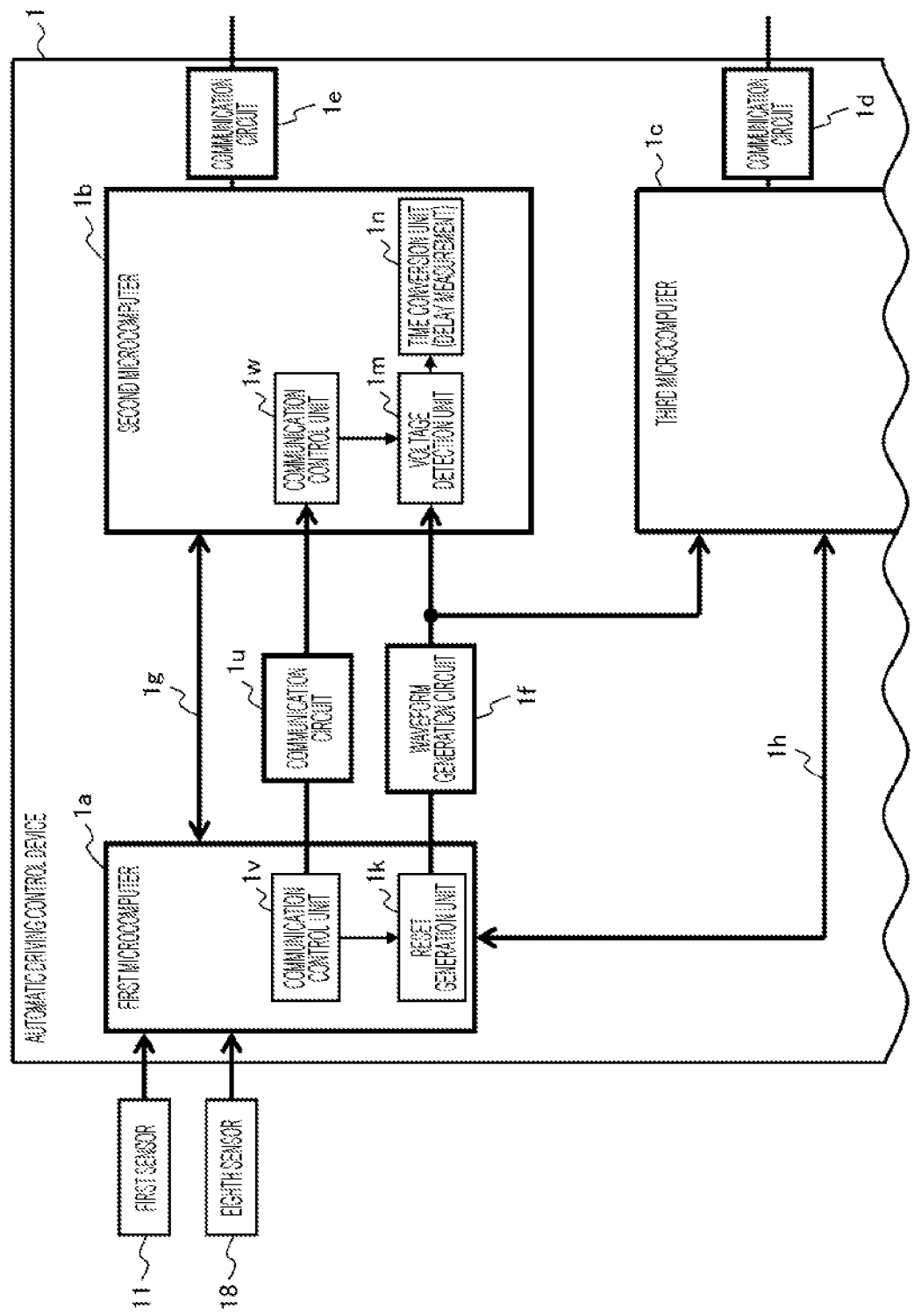
FIG. 10 is a diagram illustrating an internal configuration of an automatic driving control device (first ECU) according to a fourth embodiment of the present invention.

With reference to FIG. 10, a configuration and operations (control) of the automatic driving control device 1 according to a fourth embodiment of the present invention will be described.

FIG. 10 is a diagram illustrating an internal configuration of the automatic driving control device 1 (first ECU) according to the present embodiment. The automatic driving control device 1 of the present embodiment is different from that of the first embodiment (FIG. 2) in including a communication control unit 1v, a communication circuit 1u, and a communication control unit 1w, in place of the time information holding unit 1j and the time information holding unit 1o of the first embodiment (FIG. 2). The other components are similar to those of the first embodiment (FIG. 2).

In the present embodiment, delay of a communication circuit is measured using the waveform generation circuit 1f. The communication circuit 1u having delay, such as Ethernet Switch, is provided between the first microcomputer 1a and the second microcomputer 1b.

The first microcomputer 1a transmits time information to the second microcomputer 1b via the inter-microcomputer communication line 1g, and at the same time, the communication control unit 1v in the first microcomputer 1a provides a notification of a start of reset generation to the reset generation unit 1k. The reset generation unit 1k generates a reset signal and outputs the reset signal to the waveform generation circuit 1f.

The communication control unit 1w of the second microcomputer 1b provides the notification to the voltage detection unit 1m at the time when the reception is completed, and the voltage detection unit 1m acquires a signal waveform voltage.

The time conversion unit 1n converts the acquired voltage into time. This time is communication delay from the start of transmission by the first microcomputer 1a to the completion of reception by the second microcomputer 1b.

As described above, the electronic control device according to the present embodiment includes a communication interface (the inter-microcomputer communication line 1g, the communication circuit 1u) between the master microcomputer (the first microcomputer 1a) and the slave microcomputers (the second microcomputer 1b, the third microcomputer 1c). The master microcomputer (the first microcomputer 1a) transmits information to the slave microcomputers (the second microcomputer 1b, the third microcomputer 1c) via the communication interface (the inter-microcomputer communication line 1g, the communication circuit 1u) and at the same time, releases a reset signal of the waveform generation circuit 1f. The slave microcomputers (the second microcomputer 1b, the third microcomputer 1c) receive the information, and at the same time, acquire a voltage value of a waveform signal of the waveform generation circuit 1f, to measure delay time of the communication interface (the inter-microcomputer communication line 1g, the communication circuit 1u) from time corresponding to the acquired voltage value.

Consequently, delay time of the communication interface between the microcomputers can be accurately measured.

Fifth Embodiment

Figure 11:
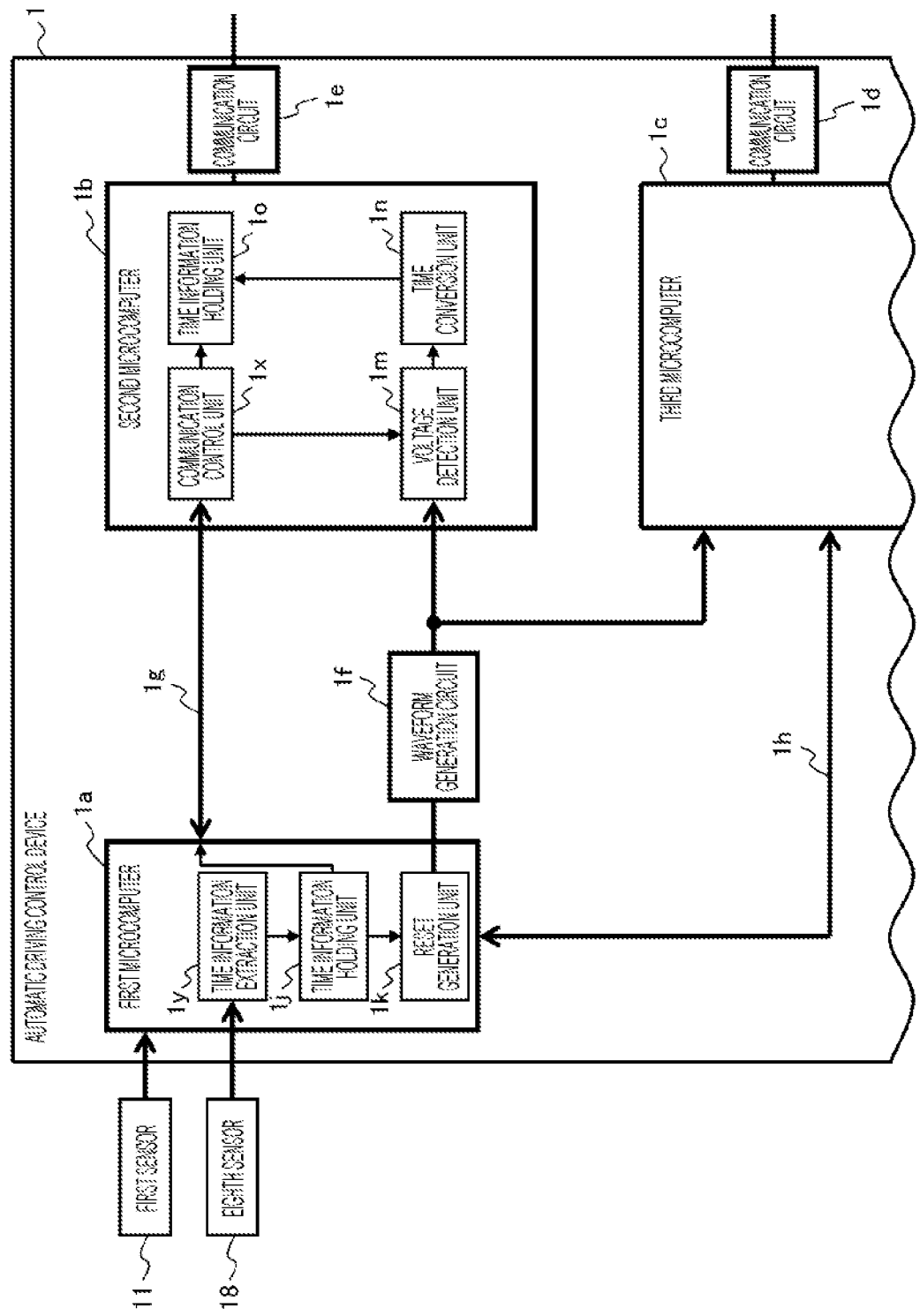
FIG. 11 is a diagram illustrating an internal configuration of an automatic driving control device (first ECU) according to a fifth embodiment of the present invention.
Figure 12:
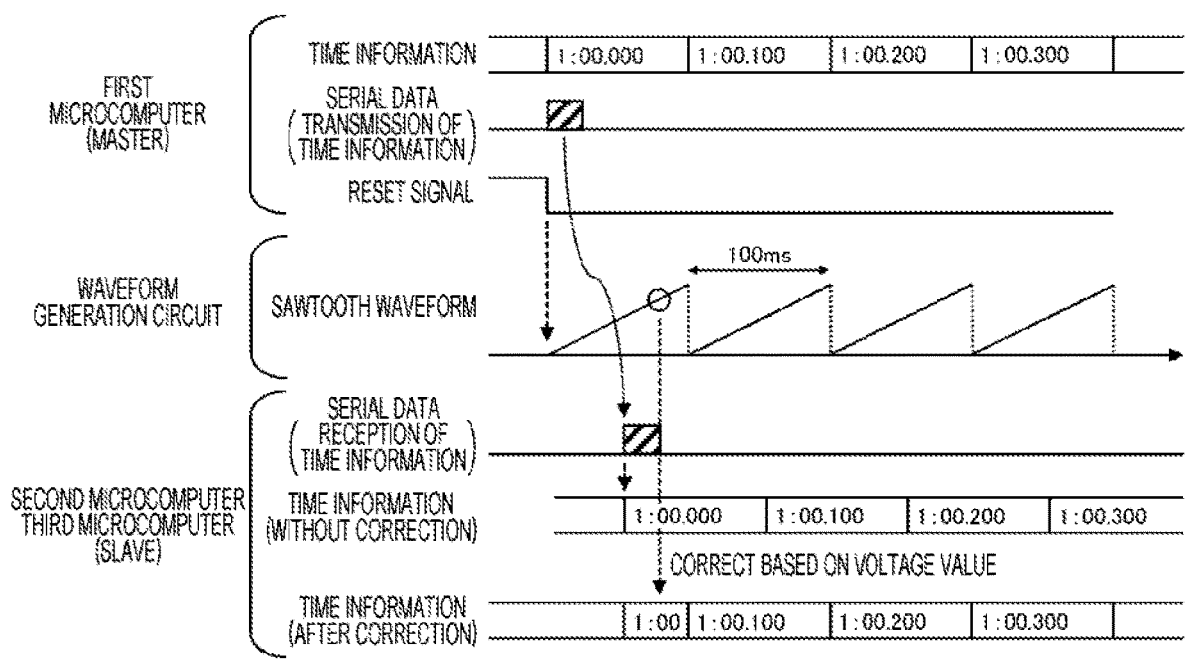
FIG. 12 is a sequence diagram illustrating a time synchronization method according to the fifth embodiment of the present invention.

With reference to FIGS. 11 and 12, a configuration and operations (control) of the automatic driving control device 1 according to a fifth embodiment of the present invention will be described.

FIG. 11 is a diagram illustrating an internal configuration of the automatic driving control device 1 (first ECU) according to the present embodiment. The automatic driving control device 1 of the present embodiment is different from that of the first embodiment (FIG. 2) in further including a time information extraction unit 1y and a communication control unit 1x in addition to the components of the first embodiment (FIG. 2). The other components are similar to those of the first embodiment (FIG. 2).

In the present embodiment, time information acquired by a GPS or the like using the waveform generation circuit 1f is shared by the microcomputers. The first microcomputer 1a calculates accurate time information from a signal input from the GPS (the eighth sensor) 18 and the like, using the time information extraction unit 1y, and provides the time information to the time information holding unit 1j.

The time information holding unit 1j transmits the time information to the second microcomputer 1b via the inter-microcomputer communication line 1g, and at the same time, provides a notification of a start of reset generation to the reset generation unit 1k. The reset generation unit 1k generates a reset signal and outputs the reset signal to the waveform generation circuit 1f.

After reset is released, the waveform generation circuit 1f periodically changes a voltage and generates a waveform in which time and a voltage have a corresponding relationship with each other.

FIG. 12 is a sequence diagram illustrating a time sharing method according to the present embodiment.

The communication control unit 1x of the second microcomputer 1b receives a communication signal from the first microcomputer 1a, and at the same time, provides a notification to the voltage detection unit 1m. The voltage detection unit 1m acquires a signal waveform voltage. Further, the communication control unit 1x extracts time information from the received signal, and provides the time information to the time information holding unit 1o.

The time conversion unit 1n converts a voltage into time by having either a correspondence table indicating a voltage-to-time corresponding relationship as illustrated in FIG. 3 or an arithmetic expression indicating a voltage-to-time corresponding relationship.

The time information holding unit 1o compares the time information received from the communication control unit 1x with the communication delay acquired by the time conversion unit 1n, and corrects the delay due to communication.

As described above, in the electronic control device according to the present embodiment, the master microcomputer (the first microcomputer 1a) transmits time information to the slave microcomputers (the second microcomputer 1b, the third microcomputer 1c) via the communication interface (the inter-microcomputer communication line 1g), and at the same time, releases a reset signal of the waveform generation circuit 1f. The slave microcomputers (the second microcomputer 1b, the third microcomputer 1c) receive the time information, and at the same time, acquire a voltage value of a waveform signal of the waveform generation circuit 1f, and correct the received time information based on time corresponding to the acquired voltage value.

Serial communication is commonly used for communication between the microcomputers (the inter-microcomputer communication line 1g). However, due to communication delay in serial communication, accurate time information cannot be transmitted. Then, as in the present embodiment, time is corrected using a waveform signal received from the waveform generation circuit 1f, whereby low-delay time synchronization can be achieved.

Further, the electronic control device according to the present embodiment includes a communication interface (the inter-microcomputer communication line 1g) between the master microcomputer (the first microcomputer 1a) and the slave microcomputers (the second microcomputer 1b, the third microcomputer 1c). The master microcomputer (the first microcomputer 1a) acquires time information using a GPS. The master computer transmits the acquired time information to the slave microcomputers (the second microcomputer 1b, the third microcomputer 1c) via the communication interface (the inter-microcomputer communication line 1g), and at the same time, releases a reset signal of the waveform generation circuit 1f. The slave microcomputers (the second microcomputer 1b, the third microcomputer 1c) receive the time information, and at the same time, acquire a voltage value of a waveform signal of the waveform generation circuit 1f, and compare time corresponding to the acquired voltage value with the time information acquired using the GPS, to correct delay time caused by the communication interface (the inter-microcomputer communication line 1g) based on a result of the comparison.

Consequently, the time information acquired using the GPS can be shared by the microcomputers, and accuracy of time synchronization between the microcomputers can be improved.

The present invention is not limited to the above-described embodiments, and includes various modifications. For example, the above-described embodiments have been described in detail to promote understanding of the present invention, and are not necessarily limited to those having all the described components. Further, a part of the components of one embodiment can be replaced with the components of another embodiment, and the components of one embodiment can be added to the components of another embodiment. Moreover, a part of the components of each embodiment can be subjected to addition of other components, removal, and replacement.

REFERENCE SIGNS LIST 1 automatic driving control device (first ECU)
2 brake control device (second ECU)
3 engine control device (third ECU)
1 power steering control device (fourth ECU)
11 camera (first sensor)
12 camera (second sensor)
13 camera (third sensor)
14 radar (fourth sensor)
15 radar (fifth sensor)
16 radar (sixth sensor)
17 radar (seventh sensor)
18 GPS (eighth sensor)
100 automatic driving system
1a first microcomputer
1b second microcomputer
1c third microcomputer
1d, 1e communication circuit
1f waveform generation circuit
1g, 1h, 1i inter-microcomputer communication line
1j time information holding unit
1k reset generation unit
1m voltage detection unit
1n time conversion unit
1o time information holding unit
1p sine-wave generation circuit
1q PWM generation unit
1r waveform generation circuit
1s voltage detection unit
1t time conversion unit
1u communication circuit
1v, 1w, 1x communication control unit
1y time information extraction unit

The invention claimed is:

1. An electronic control device comprising:
a plurality of microcomputers; and
a waveform generation circuit connected between a master microcomputer serving as a time synchronization source and a slave microcomputer that performs time synchronization, among the plurality of microcomputers, wherein
the master microcomputer outputs a reset signal synchronized with time to the waveform generation circuit,
the waveform generation circuit outputs a waveform signal corresponding to a change in time of the master microcomputer, to the slave microcomputer, and
the slave microcomputer measures a voltage value of the waveform signal and detects time corresponding to the measured voltage value.

2. The electronic control device according to claim 1, wherein
the waveform generation circuit periodically changes a voltage and outputs a waveform signal in which time in one period and a voltage value are in a one-to-one correspondence after reset is released by the reset signal, and
the slave microcomputer acquires the voltage value of the waveform signal of the waveform generation circuit and calculates time from the acquired voltage value.

3. The electronic control device according to claim 1, wherein
the waveform generation circuit periodically changes a voltage and outputs a waveform signal that is in a one-to-one correspondence with time in one period based on a voltage value and a slope of a waveform after reset is released by the reset signal, and
the slave microcomputer acquires the voltage value of the waveform signal of the waveform generation circuit and calculates time from the acquired voltage value.

4. The electronic control device according to claim 2, wherein
the waveform generation circuit is formed of parallel connection of a plurality of circuits that output waveform signals having different periods.

5. The electronic control device according to claim 2, further comprising
a communication interface between the master microcomputer and the slave microcomputer, wherein
the master microcomputer transmits information to the slave microcomputer via the communication interface and, at the same time, releases the reset signal of the waveform generation circuit, and
the slave microcomputer receives the information and, at the same time, acquires the voltage value of the waveform signal of the waveform generation circuit, to measure delay time of the communication interface from time corresponding to the acquired voltage value.

6. The electronic control device according to claim 5, wherein
the master microcomputer transmits time information to the slave microcomputer via the communication interface and, at the same time, releases the reset signal of the waveform generation circuit, and
the slave microcomputer receives the time information and, at the same time, acquires the voltage value of the waveform signal of the waveform generation circuit, to correct the received time information based on time corresponding to the acquired voltage value.

7. The electronic control device according to claim 1, further comprising
a communication interface between the master microcomputer and the slave microcomputer, wherein
the master microcomputer acquires time information using a GPS, transmits the acquired time information to the slave microcomputer via the communication interface and, at the same time, releases the reset signal of the waveform generation circuit, and
the slave microcomputer receives the time information and, at the same time, acquires the voltage value of the waveform signal of the waveform generation circuit, and compares the time information acquired using the GPS with time corresponding to the acquired voltage value, to correct delay time caused by the communication interface based on a result of the comparison.

8. The electronic control device according to claim 1, wherein
the slave microcomputer has a correspondence table indicating a voltage-to-time corresponding relationship or an arithmetic expression indicating a voltage-to-time corresponding relationship, and
time corresponding to the measured voltage value is calculated based on the correspondence table or the arithmetic expression.

9. The electronic control device according to claim 1, wherein
the waveform generation circuit outputs a sawtooth waveform in which time in one period and a voltage value are in a one-to-one correspondence.

10. The electronic control device according to claim 1, wherein
the master microcomputer outputs a PWM signal synchronized with time to the waveform generation circuit,
the waveform generation circuit outputs a sine-wave signal corresponding to a voltage and a period to the slave microcomputer based on the PWM signal, and
the slave microcomputer measures a voltage value of the sine-wave signal, and calculates time from the measured voltage value and a slope of the sine-wave signal.

11. The electronic control device according to claim 1, wherein
the electronic control device is an automatic driving control device mounted in an automatic driving system.

* * * * *